US012009233B2

(12) United States Patent
Tavakkoli Kermani Ghariehali et al.

(10) Patent No.: US 12,009,233 B2
(45) Date of Patent: *Jun. 11, 2024

(54) IMPRINT LITHOGRAPHY METHODS COMPRISING MULTIPLE PRINTHEADS CONFIGURED TO GENERATE A FLUID DROPLET PATTERN WITH A DROP EXCLUSION ZONE

(71) Applicant: CANON KABUSHIKI KAISHA, Tokyo (JP)

(72) Inventors: Amir Tavakkoli Kermani Ghariehali, Austin, TX (US); Edward Brian Fletcher, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/452,277

(22) Filed: Oct. 26, 2021

(65) Prior Publication Data
US 2022/0044943 A1 Feb. 10, 2022

Related U.S. Application Data

(63) Continuation of application No. 15/804,433, filed on Nov. 6, 2017, now abandoned.

(51) Int. Cl.
| | | |
|---|---|---|
| H01L 21/67 | (2006.01) | |
| B41J 2/005 | (2006.01) | |
| B41J 2/21 | (2006.01) | |
| B41M 3/00 | (2006.01) | |
| G03F 7/00 | (2006.01) | |

(52) U.S. Cl.
CPC .......... *H01L 21/6715* (2013.01); *B41J 2/005* (2013.01); *B41J 2/2132* (2013.01); *B41M 3/006* (2013.01); *G03F 7/0002* (2013.01)

(58) Field of Classification Search
CPC ..... H01L 21/6715; B41J 2/005; B41J 2/2132; G03F 7/0002; B41M 3/006
See application file for complete search history.

(56) References Cited

U.S. PATENT DOCUMENTS

| | | | |
|---|---|---|---|
| 8,001,924 B2 | 8/2011 | Dijksman et al. | |
| 8,556,616 B2 | 10/2013 | Resnick et al. | |
| 10,304,690 B2* | 5/2019 | Khusnatdinov | ... H01L 21/02282 |
| 11,104,057 B2* | 8/2021 | Meissl | ................... B29C 35/02 |

(Continued)

FOREIGN PATENT DOCUMENTS

WO 2013129679 A1 9/2013

*Primary Examiner* — Jeffrey M Wollschlager
*Assistant Examiner* — Guy F Mongelli
(74) *Attorney, Agent, or Firm* — Abel Schillinger, LLP

(57) ABSTRACT

An apparatus for imprint lithography can include a logic element configured to generate a fluid droplet pattern of fluid droplets of a formable material to be dispensed onto a substrate. The fluid droplet pattern includes an imprint field, wherein the imprint field has a side and a drop exclusion zone along the side, and the drop exclusion zone is narrower at a first point farther from the center of a side and wider at a second point closer to the center of the side. In another aspect, a method can be carried out using the apparatus. The apparatus and method can be useful in filling an imprint field with a formable material relatively quickly without extrusion defects or other complications.

10 Claims, 8 Drawing Sheets

(56) References Cited

U.S. PATENT DOCUMENTS

| | | |
|---|---|---|
| 2005/0100830 A1 | 5/2005 | Xu et al. |
| 2007/0070108 A1 | 3/2007 | Mantell et al. |
| 2007/0132152 A1 | 6/2007 | Choi et al. |
| 2007/0170617 A1 | 7/2007 | Choi et al. |
| 2007/0237886 A1 | 10/2007 | Dijksman et al. |
| 2007/0284779 A1 | 12/2007 | Wu et al. |
| 2008/0018875 A1 | 1/2008 | Schram et al. |
| 2008/0145773 A1 | 6/2008 | Wang et al. |
| 2010/0101493 A1 | 4/2010 | Hodge et al. |
| 2011/0046764 A1 | 2/2011 | Kan |
| 2011/0183070 A1 | 7/2011 | Choi |
| 2012/0038031 A1 | 2/2012 | Sachs et al. |
| 2012/0080825 A1 | 4/2012 | Mitsui |
| 2013/0010020 A1 | 1/2013 | Kodama |
| 2014/0009525 A1* | 1/2014 | Kelly .................... B41J 29/393 |
| | | 347/14 |
| 2015/0158240 A1 | 6/2015 | Haase et al. |
| 2015/0224763 A1 | 8/2015 | Clippingdale et al. |
| 2016/0039126 A1 | 2/2016 | Tan et al. |
| 2016/0306275 A1 | 10/2016 | Park et al. |
| 2017/0120641 A1 | 5/2017 | Hoshi |
| 2017/0165898 A1* | 6/2017 | Meissl .................. G03F 7/0002 |
| 2017/0184958 A1 | 6/2017 | Kawamura et al. |
| 2017/0207080 A1 | 7/2017 | Kuga |
| 2017/0274427 A1 | 9/2017 | Sakurai et al. |
| 2017/0285479 A1 | 10/2017 | Stachowiak et al. |
| 2018/0201030 A1 | 7/2018 | Yamazaki et al. |
| 2018/0277383 A1* | 9/2018 | Khusnatdinov ... H01L 21/02318 |
| 2018/0329315 A1 | 11/2018 | Hirano |
| 2019/0139789 A1* | 5/2019 | Tavakkoli Kermani |
| | | Ghariehali ............... B41J 2/005 |

\* cited by examiner

IMPRINT LITHOGRAPHY METHODS COMPRISING MULTIPLE PRINTHEADS CONFIGURED TO GENERATE A FLUID DROPLET PATTERN WITH A DROP EXCLUSION ZONE

CROSS REFERENCE TO RELATED APPLICATIONS

This application is a continuation of and claims priority under 35 U.S.C. § 120 to U.S. patent application Ser. No. 15/804,433, entitled "APPARATUS FOR IMPRINT LITHOGRAPHY COMPRISING A LOGIC ELEMENT CONFIGURED TO GENERATE A FLUID DROPLET PATTERN AND A METHOD OF USING SUCH APPARATUS," by Amir Tavakkoli Kermani Ghariehali et al., filed Nov. 6, 2017, which is assigned to the current assignee hereof and incorporated by reference in its entirety.

FIELD OF THE DISCLOSURE

The present disclosure relates to apparatuses for imprint lithography, and more particularly to apparatuses including a logic element to generate a fluid droplet pattern.

RELATED ART

Imprint lithography apparatuses and processes are useful in forming nanoscale patterns on semiconductor wafers in the fabrication of electronic devices. Such apparatuses and processes can include the use of fluid dispense systems for depositing a formable material, for example, a polymerizable material, such as a resin or a resist, onto the wafer, using techniques such as fluid droplet dispense. The dispensed material is contacted with an imprint template (or mold) having desired pattern features and then solidified, forming a patterned layer on the wafer. Template feature fill rates and related defects are dependent, in part, on template pattern feature density and orientation and the droplet pattern arrangement, including the fluid droplet pitch.

Traditional fluid dispense systems permit have a rectilinear pattern of fluid droplet. Such a pattern may take a significant amount of time to form properly features and a residual layer corresponding to a template. Thus, there continues to be an industry demand for droplet pattern processes that allow for quicker times to form properly resist patterns.

SUMMARY OF THE DISCLOSED EMBODIMENTS

In an aspect, an apparatus for imprint lithography can include a logic element configured to generate a fluid droplet pattern of fluid droplets of a formable material to be dispensed onto a substrate, wherein the fluid droplet pattern includes an imprint field, wherein the imprint field has a side and a drop exclusion zone along the side, and the drop exclusion zone is narrower at a first point farther from a center of the side and wider at a second point closer to the center of the side.

In an embodiment, the fluid droplet pattern is organized in rows, wherein each row includes a terminal fluid droplet along a boundary of the drop exclusion zone.

In a particular embodiment, a first terminal fluid droplet is along a first row, and a second terminal fluid droplet is along a second row, the center of the side of the imprint field is closer to the second terminal fluid droplet than to the first terminal fluid droplet, and the first terminal fluid droplet has a corresponding first DEE, and the second terminal fluid droplet has a corresponding second DEE that is longer than the first DEE.

In a more particular embodiment, the fluid droplet pattern is arranged in rows that extend in a translating direction and has a translating fluid droplet pitch, and a difference between the second and first DEEs is less than the translating fluid droplet pitch.

In another embodiment, an angle between the side of the imprint field and a length of a fluid dispenser is configured to be changed during a pass or between different passes.

In a particular embodiment, a fluid dispense system comprises a first fluid dispenser and a second fluid dispenser.

In a more particular embodiment, the first and second fluid dispensers are in different rotational directions with respect to the side of the imprint field.

In another more particular embodiment, the first fluid dispenser and the second fluid dispenser are along different sides of the imprint field.

In a further more particular embodiment, the first fluid dispenser and the second fluid dispenser are along adjacent sides of the imprint field.

In an even more particular embodiment, the first fluid dispenser has a length that lies along a first line, the second fluid dispenser has a length that lies along a second line, and the first and second lines intersect at an angle other than 90°.

In another aspect, an imprint lithography method can include generating a fluid droplet pattern of fluid droplets of a formable material to be dispensed onto a substrate, wherein the fluid droplet pattern includes an imprint field, wherein: the imprint field has a side and a drop exclusion zone along the side; and the drop exclusion zone is narrower at a first point farther from a center of the side and wider at a second point closer to the center of the side; and dispensing fluid droplets of the formable material onto the substrate corresponding to the fluid droplet pattern.

In an embodiment, dispensing the fluid droplets of the formable material is performed during a single pass using a first fluid dispenser and a second fluid dispenser that are in different rotational positions with respect to each other.

In another embodiment, dispensing the fluid droplets of the formable material comprises dispensing a first set of the fluid droplets using a fluid dispenser during a first pass; rotating the fluid dispenser, the substrate, or both; and dispensing a second set of the fluid droplets using the fluid dispenser during a second pass.

In still another embodiment, dispensing the fluid droplets of the formable material comprises dispensing a first set of the fluid droplets using a first fluid dispenser and a second set of fluid droplets using a second fluid dispenser during a pass, and rotating the first fluid dispenser, the second fluid dispenser, the substrate or any combination during the pass.

In a further embodiment, the method of claim further comprises providing an apparatus having a fluid dispense system that includes a first fluid dispenser and a second fluid dispenser, wherein: the first fluid dispenser and the second fluid dispenser are oriented along adjacent sides of the imprint field before dispensing the fluid droplets; the first fluid dispenser has a length that lies along a first line; the second fluid dispenser has a length that lies along a second line; and the first and second lines intersect at an angle other than 90°.

In a particular embodiment, dispensing the fluid droplets of the formable material comprises dispensing a first set of the fluid droplets using the first fluid dispenser, and dispensing a second set of the fluid droplets using the second fluid dispenser.

In another embodiment, generating the fluid droplet pattern is performed such that, wherein on an intra-row basis, fluid droplets from each of first and second passes or different fluid dispensers along a row has a predetermined local volume of the formable material.

In a particular embodiment, the fluid droplets from the first and second passes meet at a junction that is spaced apart from a central portion of the imprint field.

In a further aspect, a method of manufacturing an article can include: providing a fluid dispense system having fluid dispense ports; generating a fluid droplet pattern of fluid droplets of a formable material to be dispensed onto a substrate, wherein the fluid droplet pattern includes an imprint field, wherein: the imprint field has a side and a drop exclusion zone along the side; and the drop exclusion zone is narrower at a first point farther from a center of the side and wider at a second point closer to the center of the side; and moving a substrate of the article and the fluid dispense ports relative to each other; dispensing fluid droplets of the formable material onto the substrate corresponding to the fluid droplet pattern; contacting the formable material with the template having a patterned surface; and curing the formable material to form a patterned layer corresponding to the patterned surface of the template.

In an embodiment, the article includes an electronic device, and the substrate includes a semiconductor wafer.

BRIEF DESCRIPTION OF THE DRAWINGS

Embodiments are illustrated by way of example and are not limited in the accompanying figures.

Figure 1:
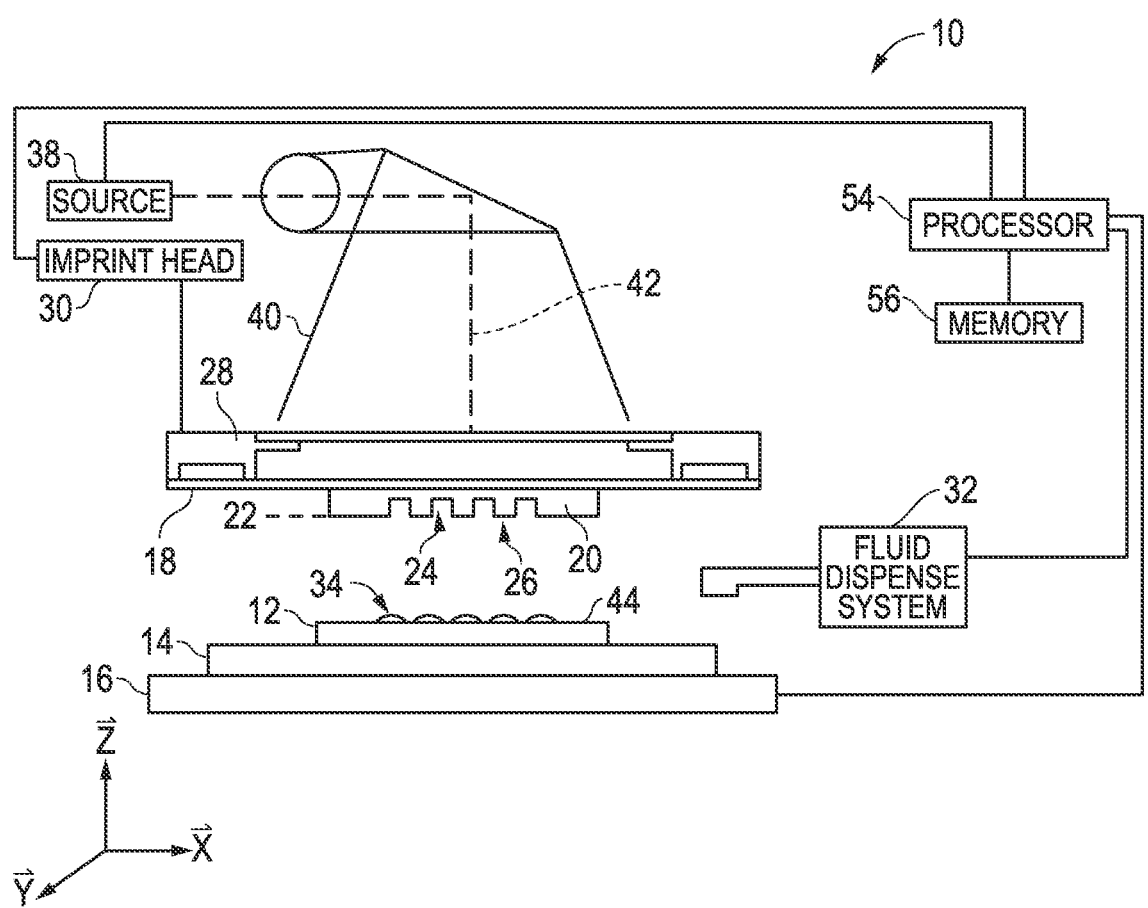
FIG. 1 includes an illustration of a side view of an exemplary imprint lithography system.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term "terminal fluid droplet," when a fluid droplet pattern is organized in rows, columns, or rows and columns, is intended to mean a fluid drop along such row or column that is closest to a side of an imprint field. A row or column can have terminal fluid droplets at opposite ends of such row or column.

The term "drop edge exclusion" or "DEE" is intended to mean a shortest distance between a terminal fluid droplet and its adjacent side of an imprint field. Each side can have a plurality of DEEs with each DEE corresponding to a row or column of fluid droplets.

The term "drop exclusion zone" or "DEZ" is intended to mean an area of an imprint field defined by a side of the imprint field and a line passing through centers of terminal fluid droplets that are closest to such side.

The term "pitch" is intended to mean a distance from a center of a feature to a center of a next adjacent feature. For a fluid droplet pattern, the fluid droplet pitch is a distance from the center of a fluid droplet to the center of the next adjacent fluid droplet. In Cartesian coordinates, a two-dimensional pattern (a pattern as seen from a top view) can have a pitch in the X-direction that corresponds to the distance between the centers of the features as measured in the X-direction (X-direction pitch), and a pitch in the Y-direction that corresponds to the distance between the centers of the features as measured in the Y-direction (Y-direction pitch). The X-direction pitch may be the same or different from the Y-direction pitch.

As used herein, velocity and motion may be described on a relative basis. For example, object A and object B move relative to each other. Such terminology is intended to cover object A is moving, and object B is not; object A is not moving, and object B is moving; and both of objects A and B are moving.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

A fluid droplet pattern can be formed that allows for quicker filling of an imprint field without extrusion defects or other complications. In an aspect, an apparatus for imprint lithography can include a logic element configured to generate a fluid droplet pattern of fluid droplets of a formable material to be dispensed onto a substrate. The fluid droplet pattern can include an imprint field, wherein the imprint field has a side and drop exclusion zone along the side. The drop exclusion zone can be narrower at a first point farther from a center of the side and wider at a second point closer to the center of the side. In another aspect, the apparatus can be used is performing a method to form the fluid droplet pattern on the substrate.

Details regarding the apparatus and method are better understood after reading this specification in conjunction with figures. The description below is meant to illustrate embodiments and not limit the scope of the present invention, which is defined in the appended claims.

Referring to FIG. 1, a lithographic system 10 in accordance with an embodiment described herein can be used to form a relief pattern on a substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. The substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mold 20 extending therefrom towards the substrate 12. The mold 20 is sometimes referred to as a mesa. In an embodiment, the template 18 can be formed without a mold 20.

The template 18, mold 20, or both may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, an imprint surface 22 of the mold 20 includes features defined by spaced-apart recesses 24 and protrusions 26. The imprint surface 22 may define any original pattern that forms the basis of a pattern to be formed on the substrate 12. In another embodiment, the imprint surface 22 can be a blank, that is, the imprint surface 22 does not have any recesses or protrusions.

The template 18 can be coupled to a chuck 28. The chuck 28 can be configured as vacuum, pin-type, groove-type, electrostatic, electromagnetic, or another similar chuck type. In an embodiment, the chuck 28 may be coupled to an imprint head 30 such that the chuck 28 or imprint head 30 can facilitate movement of the template 18.

The lithographic system 10 can further include a fluid dispense system 32 used to deposit a formable material 34 on the substrate 12. For example, the formable material 34 can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold 20 and the substrate 12, depending on design considerations. For example, the formable material 34 can include a monomer mixture that can be cured using ultraviolet light, heat, or the like.

The lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56. The logic element 54 may be a processor (for example, a central processing unit of a microprocessor or microcontroller), a field-programmable gate array (FPGA), an application specific integrated circuit (ASIC), or the like. The processor, FPGA, or ASIC can be within the apparatus. In another embodiment (not illustrated), the logic element can be a computer external to the apparatus 10 and is bidirectionally coupled to the apparatus 10.

While the formation of a patterned layer over the substrate 12 using the formable material 34 is relatively simple on a conceptual basis, the patterned layer is significantly difficult, particularly in view of the small dimensions, avoiding direct contact between the template 18 and the substrate 12, and desire for high throughput for the apparatus 10. In this specification, new fluid droplet patterns can be used to achieve relatively high volume production for the apparatus and without increasing defects, such as extrusion defects.

U.S. Pat. No. 8,556,616 illustrates a fluid droplet pattern and how the fluid droplets coalesce when a template contacts the fluid droplets. In particular, FIG. 9 of U.S. Pat. No. 8,556,616 illustrates a fluid droplet pattern before a template contacts the fluid droplets 54. FIGS. 17 to 20 of U.S. Pat. No. 8,556,616 include illustrations of how the fluid droplets 54 coalesce and form an interface 88, which represents a fluid front, that moves from the center of an imprint field radially outward at different points in time. As can be seen in FIG. 20, the interface 88 reaches centers along the sides of the imprint field before reaching corners of the imprint field. By the time the interface 88 moves significantly closer to the corners (at a point in time later than FIG. 20), the likelihood of an extrusion defect near the center of any one or more of the sides is significantly higher.

An extrusion defect is a portion of a resist layer that extends beyond any side of the mold 20 during the imprint process. Before the inventors' discovery, uniform DEEs were used along a side of an imprint field resulting in a DEZ having a uniform width. The distances for DEEs may be made uniformly larger or uniformly smaller; however, such alternatives have other consequences. To minimize extrusions at the edge center regions, larger DEEs, an earlier cure of the formable material, or both can be used, but such a change may significantly increase a risk of having more non-fill defects in the corner areas because those areas may not have had sufficient time for adequate droplet spreading and filling. If smaller DEEs, waiting for more filling to occur in the corner areas, or both are used, such a change may significantly increase the risk of more extrusion defects at the edge center regions.

The inventors have discovered that a fluid droplet pattern can use variable DEEs resulting in a DEZ that is indented farther into the imprint field closer to a centerpoint along a side of the imprint field. Thus, a portion of DEZ is wider and the distances for the corresponding DEEs are longer near the centerpoint of the side of the imprint field, as compared to another portion of the DEZ and corresponding DEEs farther from the centerpoint. The pattern helps to flow fluid droplets of a formable material 34, so that the formable material 34 reaches all points of the template 18 along a side of the imprint field closer in time as compared to one another without significantly increasing the risk of forming an extrusion defect.

In essence, when using variable DEEs, the fluid droplet placement better synchronizes the spreading/filling along the entirety of the field edge (from center edge outward to corners) as compared to droplet pattern having a uniform width of the DEZ and uniform distances for the DEEs along the side of the imprint field. Thus, a variable DEE approach, when used with a center-to-perimeter template-substrate contact scheme, provides for a better balance of extrusion control (near the centers of the field edges) vs. non-fill control (at the field corners).

Figure 2:
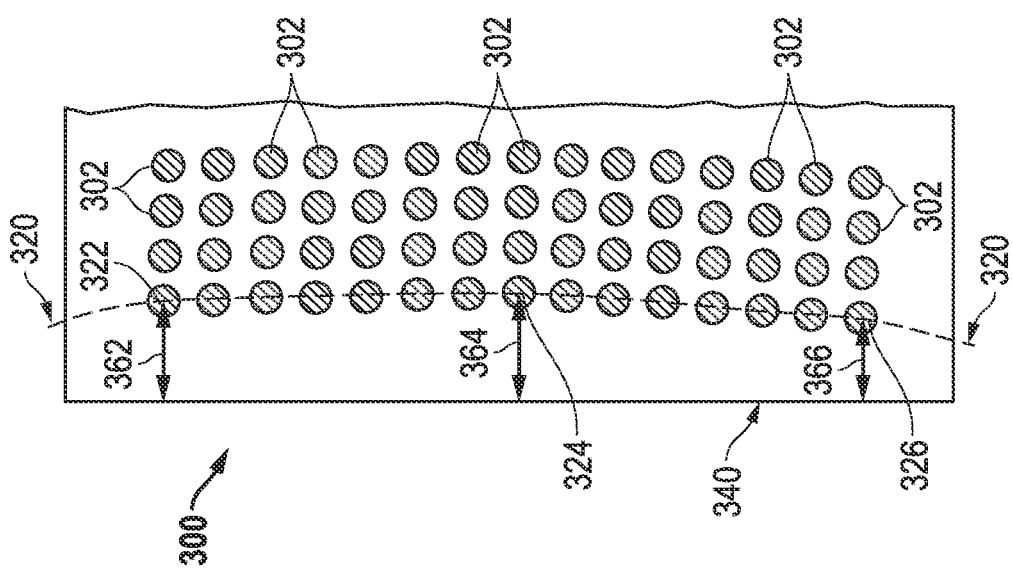
FIG. 2 includes an illustration of a fluid droplet pattern.

FIG. 2 illustrates a portion of a fluid droplet pattern 300. The fluid droplet pattern 300 of fluid droplets 302 of the formable material 34 is disposed within an imprint field. The imprint field has a side 340 and a DEZ along the side 340. In an embodiment, the fluid droplet pattern 300 is organized in rows, and each row includes a terminal fluid droplet along a boundary of the DEZ. The rows of the fluid droplet pattern 300 extend in a translating direction, which is the direction in which the substrate 12 and the template 18 move relative to each other. Fluid droplets 302 are dispensed in the translating direction at a translating fluid droplet pitch. As used in this specification, the translating direction is referred as the x-direction, and the translating fluid droplet pitch is an X-direction pitch.

The DEZ is the area between the side 340 and the dashed line 320 that passes though the terminal fluid droplets, including terminal fluid droplets 322, 324, and 326. For the fluid droplet pattern 300 illustrated in FIG. 2, the terminal fluid droplets 322, 324, and 326 have corresponding DEEs 362, 364, and 366, respectively. The DEZ is narrower farther from the center of the side 340 and wider closer to the center of the side 340. The DEE 364 corresponding to the terminal fluid droplet 324 is greater than each of the DEEs 362 and 366 corresponding to the terminal fluid droplets 322 and 326. The difference between the DEE 364 and each of the DEEs 362 and 366 is less than the translating direction (x-direction) pitch. In another embodiment, the difference between the DEE 364 and each of the DEEs 362 and 366 may be the same or greater than the translating direction (x-direction) pitch.

As will be described in more detail later in this specification, the fluid droplet pattern 300 can be formed by rotating a fluid dispenser, a substrate, or both. In an embodiment, the rotation may be performed so that it is at most the same as the x-direction pitch. For example, the fluid droplet pattern 300 corresponds to a rotational angle of 2 milliradians (mrads) when the distance between the centers of the fluid droplets 322 and 326 is approximately 33 mm. The DEE 364 is 210 microns, and the DEEs 362 and 366 are 175 microns. Thus, the difference in DEEs is 35 microns in this particular embodiment.

Figure 3:
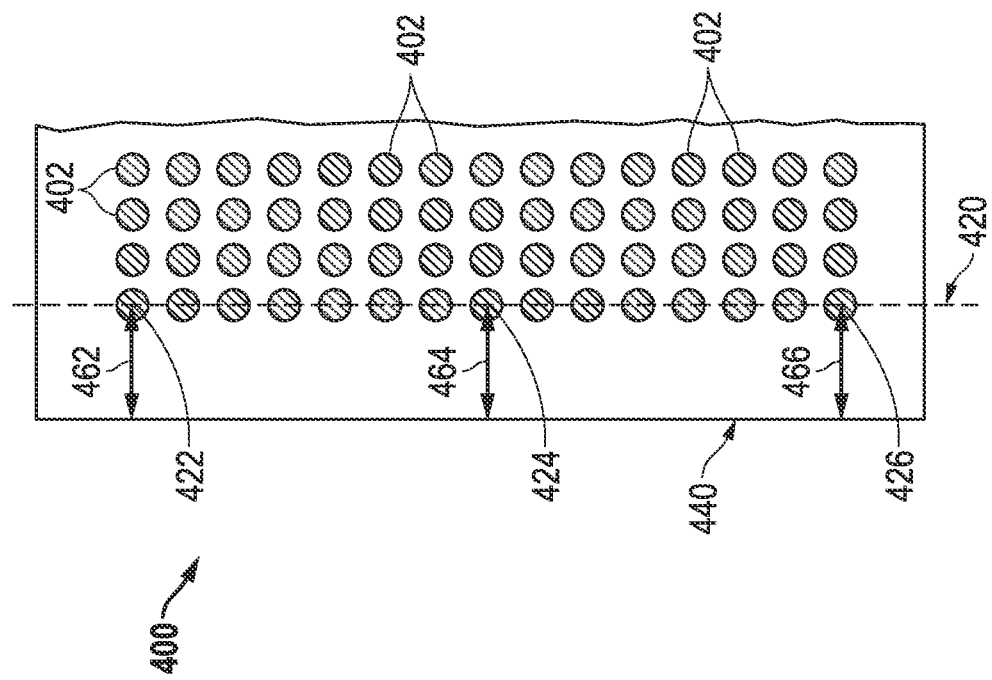
FIG. 3 includes an illustration of another fluid droplet pattern.

FIG. 3 illustrates a portion of a fluid droplet pattern 400 and a corresponding set of photographs of a resist layer as seen through the imprint template 18. The fluid droplet pattern 400 of fluid droplets 402 of the formable material 34 is disposed within an imprint field. The imprint field has a side 440 and a DEZ along the side 440. In an embodiment, the fluid droplet pattern 400 is organized in rows, and each row includes a terminal fluid droplet along a boundary of the DEZ. The rows of the fluid droplet pattern 400 extend in a translating direction, which is the direction in which the substrate 12 and the template 18 move relative to each other. Fluid droplets 402 are dispensed in the translating direction at a translating fluid droplet pitch. As used in this specification, the translating direction is referred as the x-direction, and the translating fluid droplet pitch is an X-direction pitch.

The DEZ is the region between the side 440 and the dashed line 420 that passes through the terminal fluid droplets, including terminal fluid droplets 422, 424, and 426. For the fluid droplet pattern 400 illustrated in FIG. 3, the terminal fluid droplets 422, 424, and 426 have corresponding DEEs 462, 464, and 466, respectively, that are uniform. Unlike FIG. 2, in FIG. 3, the DEZ has a substantially uniform width along the side 440.

In FIG. 3, the fluid droplet pattern 400 corresponds to a rotational angle of zero. In other words, the substrate and fluid droplet dispenser(s) is (are) not rotated relative to each other. The distances 462, 464, and 466 along the side 440 are all 180 microns. Thus, the differences in DEEs are zero.

The amount of rotation and indentation may depend on the pattern of recessions and protrusions along the imprint surface 22 of the template 18. When imprinting using the fluid droplet patterns 300 and 400, a camera or another visual tool may be used to monitor how the fluid front is progressing from the center of the imprint fields to the edges of the imprint fields. Alternatively or in conjunction with the camera or visual tool during imprinting, the formable material may be cured, and the printed and inspected for the presence and location of non-fill defects and extrusion defects. Ideally, there are not any non-fill defects extrusion defects for a particular rotation, and such rotation may be used. If there are extrusion defects at any of the corners, non-fill defects near a centerpoints of the edges, or both, the rotation may be adjusted to a lower value. Thus based information gathered, the angle of rotation may be determined.

Figure 4:
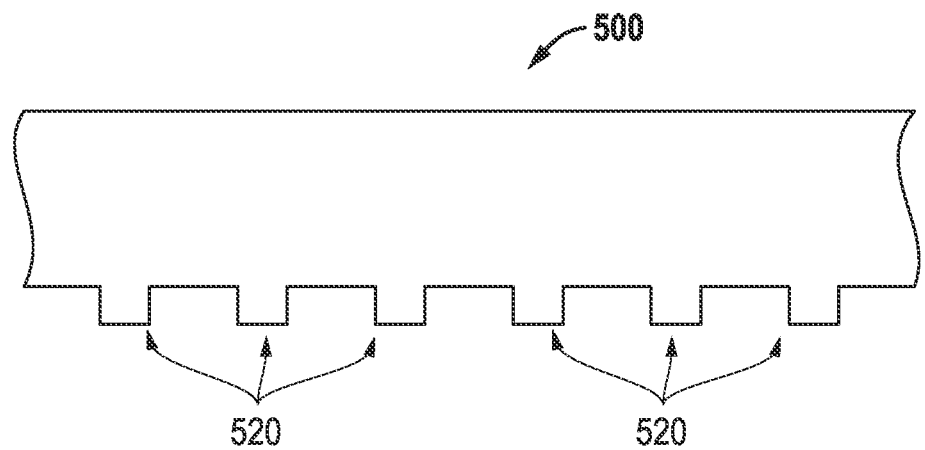
FIG. 4 includes an illustration of a side view of a portion of a fluid dispenser and fluid dispense ports.

The indentation of the DEZ along sides of the imprint field can be obtained using different equipment configurations and techniques, some of which are described and illustrated herein. After reading this specification, skilled artisans will appreciate that other embodiments can be used without departing from the concepts as described here. An exemplary fluid dispenser is illustrated in FIG. 4 before addressing other aspects of the equipment configurations and technique as illustrated in FIGS. 5 to 12. In FIGS. 5 to 12, not all fluid droplets are illustrated to aid in understanding the concepts, and therefore, only those fluid droplets near the sides are illustrated.

FIG. 4 includes a side view of a portion of a fluid dispenser 500. The fluid dispenser 500 includes fluid dispense ports 520 through which the formable material is dispensed. The fluid dispense ports 520 are oriented along one or more lines that are substantially parallel to the length of the fluid dispenser 500. Any one or more of the embodiments described below can use the fluid dispenser 500.

Figure 5:
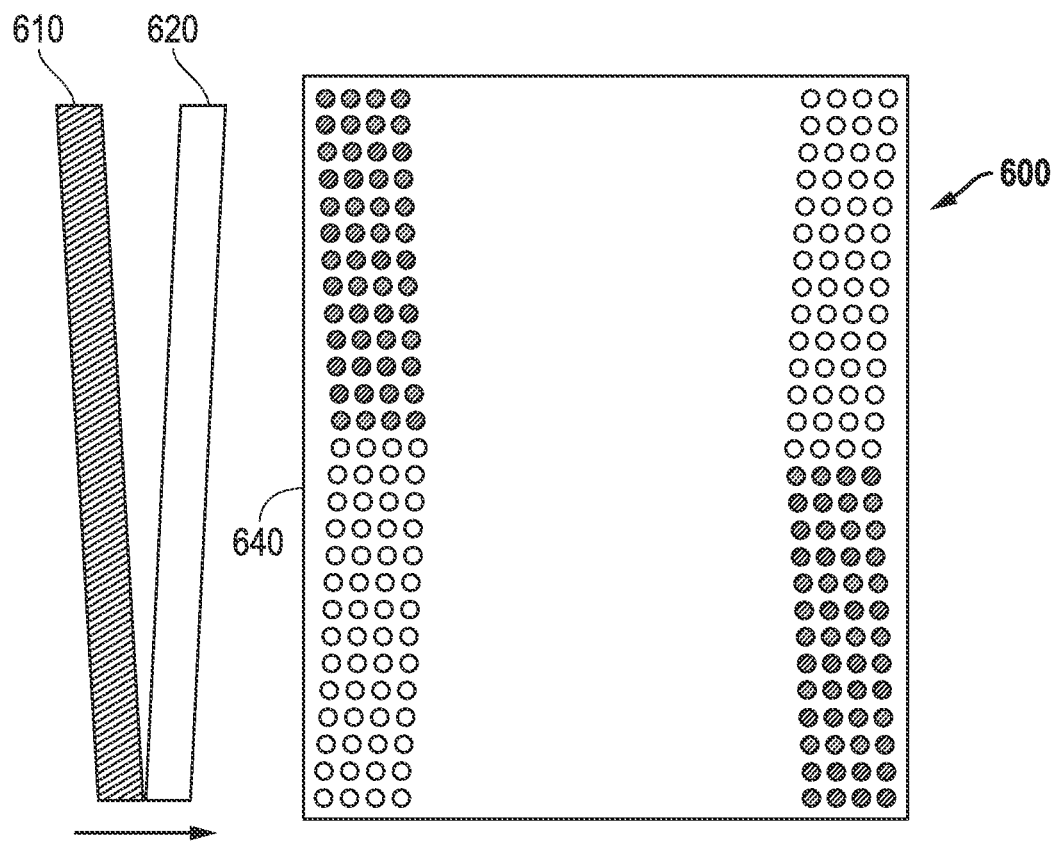
FIG. 5 includes an illustration of a set of fluid dispensers and part of a fluid droplet pattern for an imprint field having fluid droplets near opposing sides of an imprint field.

FIG. 5 includes an illustration of a portion of a fluid dispense pattern 600 in accordance with an embodiment in which fluid dispensers 610 and 620 are rotated with respect to a side 640, and the fluid droplet pattern 600 is formed with a single pass. Referring to FIG. 5, the fluid dispense system 32 includes the fluid dispenser 610 and the fluid dispenser 620, and the fluid dispensers 610 and 620 are oriented in different rotational directions with respect to the side 640 of the imprint field. In a particular embodiment, the fluid dispenser 610 is rotated counterclockwise with respect to the side 640, and the fluid dispenser 620 is rotated clockwise with respect to the side 640. The fluid dispensers 610 and 620 rotate with small positive and small negative angles relative to the side 640 of the imprint field, and the fluid droplet pattern 600 can be achieved with a single pass as shown in FIG. 5. In the embodiment as illustrated, the dispensers 610 and 620 remain at substantially the same relative angle during a single pass. The upper left and lower right quadrants of fluid droplets are formed using the fluid dispenser 610, and the lower left and upper right quadrants of fluid droplets are formed using the fluid dispenser 620.

Figure 6:
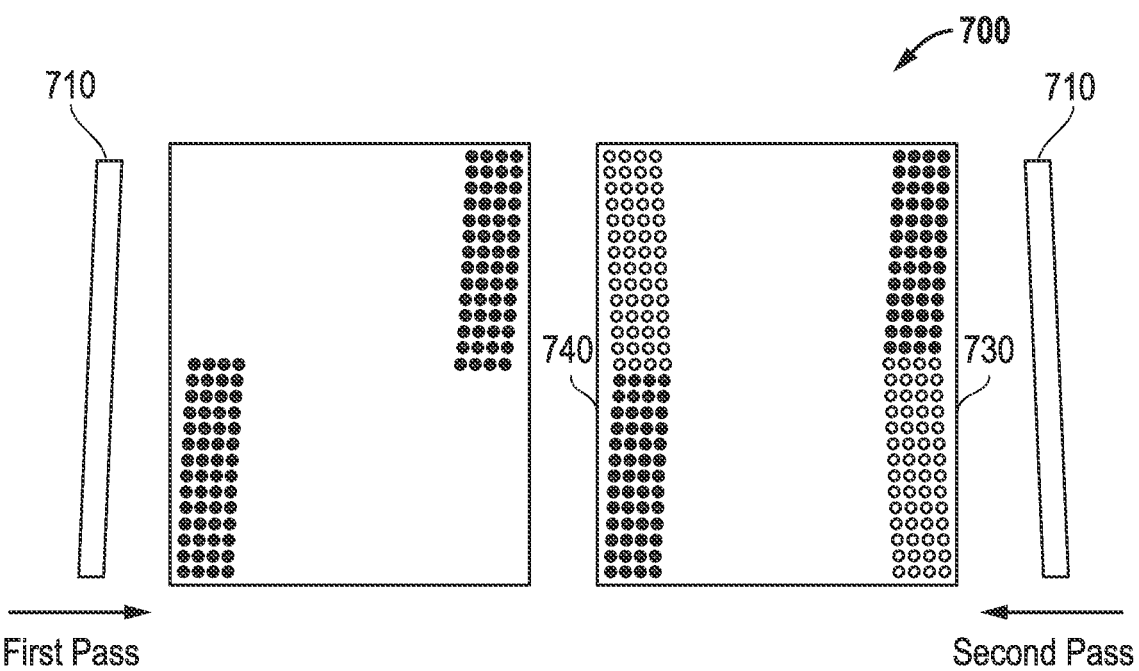
FIG. 6 includes an illustration of a fluid dispenser and part of a fluid droplet pattern for an imprint field having fluid droplets near opposing sides of an imprint field that can be generated using two dispense passes.

FIG. 6 includes an illustration of a portion of a fluid dispense pattern 700 in accordance with an embodiment in which the fluid dispense system 32 includes a fluid dispenser 710 that is rotated one way relative to the side 740 for one pass and rotated the other way to the side 730 for the other pass. The angle of rotation may or may not be the same. Relative to the side 740, the fluid dispenser 710 rotates clockwise in a positive angle in the first pass, and rotates counterclockwise in a negative angle in the second pass to form the fluid droplet pattern 700. In particular, fluid droplets in the lower left and upper right quadrants are formed during one pass, the angle of rotation of the fluid dispenser is changed, and then fluid droplets in the lower right and upper left quadrants are formed during the other pass.

Figure 7:
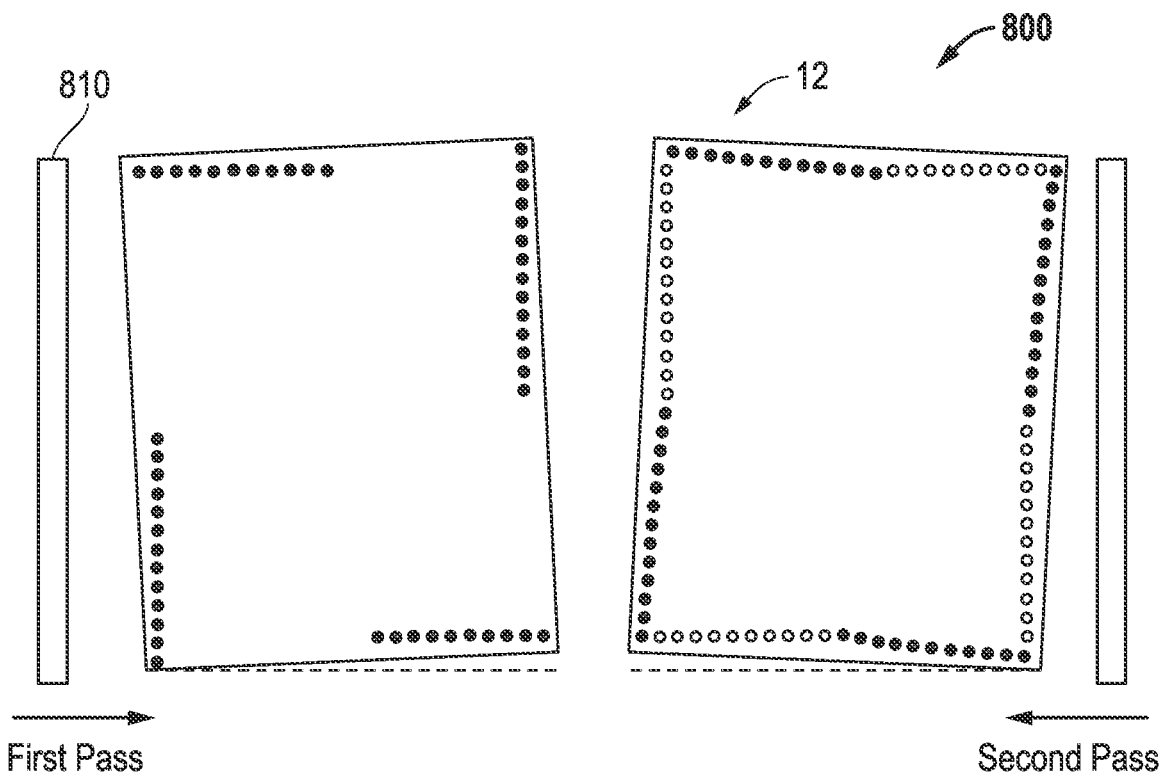
FIG. 7 includes an illustration of a fluid dispenser and part of a fluid droplet pattern for an imprint field having fluid droplets near opposing sides of an imprint field that can be generated using two dispense passes.

FIG. 7 has an equipment configuration similar to FIG. 6. FIG. 7 can be useful when all sides, rather than just two opposing sides, have indentations for the DEZs. In the embodiment illustrated in FIG. 7, the substrate 12, rather than the fluid dispenser 810, is rotated when generating the fluid droplet pattern 800. The fluid dispenser 810 remains fixed (no rotation) during two different passes, where the substrate 12 rotates in small positive and negative angles between the two different passes.

Figure 8:
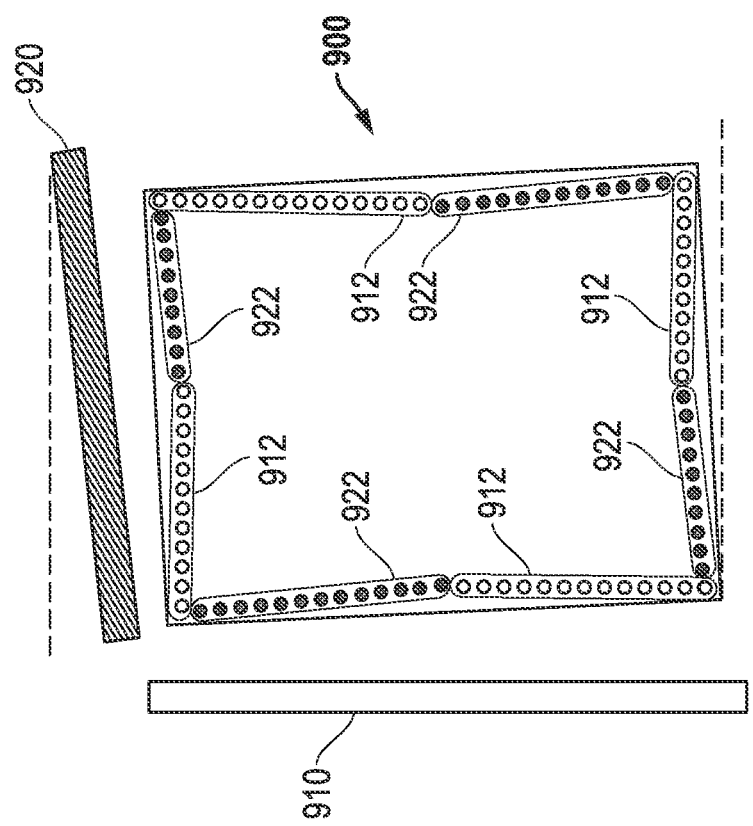
FIG. 8 includes an illustration of fluid dispensers and part of a fluid droplet pattern for an imprint field having fluid droplets near opposing sides of an imprint field that can be generated using two dispense passes.

FIG. 8 includes an illustration of a more complex equipment configuration in which different fluid dispensers 910 and 920 that extend along lengths that are oriented along adjacent sides of the imprint field 900. The fluid dispenser 910 is positioned along one side of the imprint field perpendicular to the dispense scan direction (X-direction) and forms fluid droplets 912 during one scan. The fluid dispenser 920 is positioned along another side of the imprint field and forms fluid droplets 922 during another scan. Lengths of the fluid dispensers 910 and 920 are along lines that intersect at an angle other than 90°. The substrate is rotated with respect to both fluid dispensers 910 and 920. In other words, the lengths of the fluid dispensers 910 and 920 are not parallel with their corresponding sides.

Figure 9:
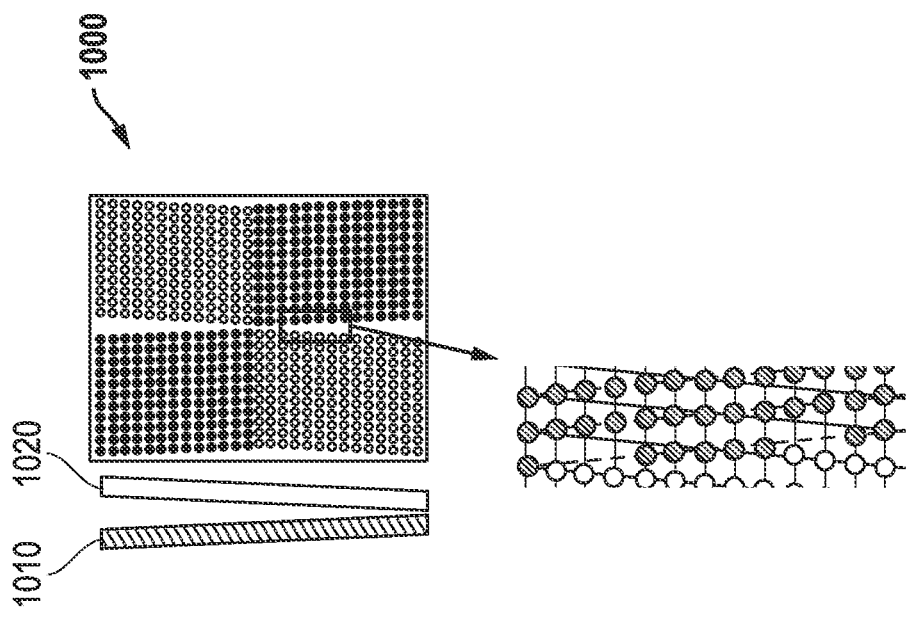
FIG. 9 includes an illustration of fluid dispensers and part of a fluid droplet pattern for an imprint field having fluid droplets from different passes stitched together.

In one or more of the previous embodiments, portions of the fluid droplet pattern may be stitched together to keep the fluid droplet pitch more uniform in the translating direction. The embodiment illustrated in FIG. 9 can be formed similar to the embodiment as described with respect to FIG. 5. FIG. 9 illustrates the fluid dispensers 1010 and 1020 as previously described and includes a fluid droplet pattern 1000 for an imprint field having fluid droplets from different quadrants stitched together in accordance with an embodiment. The two quadrants of fluid droplet along the upper side and the two quadrants of fluid droplet along the lower side are relatively close to each other near the center of the fluid droplet pattern 1000. Without stitching, significant gaps between the fluid droplet quadrants along the upper and lower sides may occur. On an intra-row basis, stitching allows the fluid droplets along a row to have spacings more consistent with the fluid droplet pitch and have a predetermined local volume of the formable material. Stitching can be useful when more than one fluid dispenser or more than one pass is used to generate a fluid droplet pattern.

Figure 10:
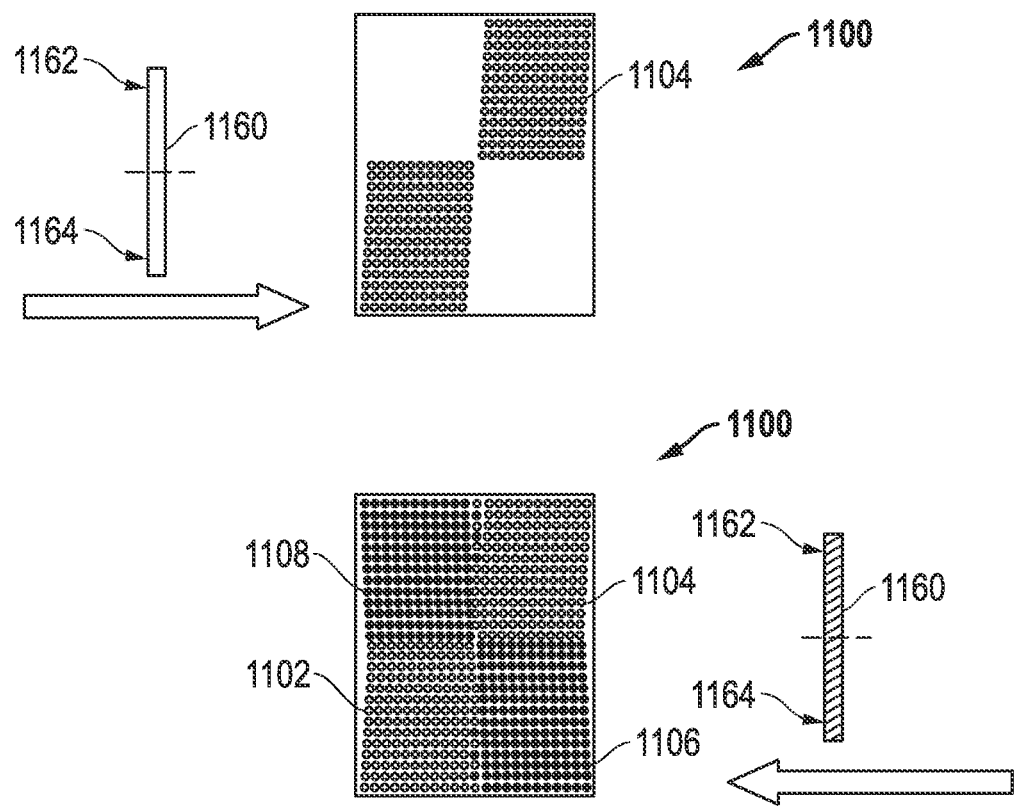
FIG. 10 includes an illustration of a fluid dispenser and a fluid droplet pattern for an imprint field having fluid droplets where rotation in a Y-Z plane is used.
Figure 11:
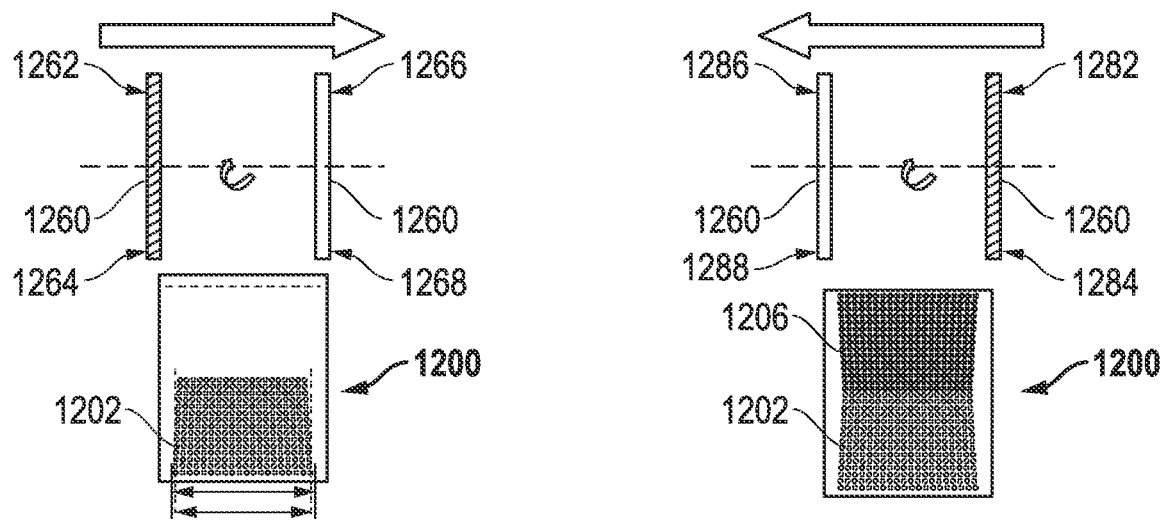
FIG. 11 includes an illustration of a fluid dispenser and a fluid droplet pattern for an imprint field having fluid droplets where rotation in a Y-Z plane is used.
Figure 12:
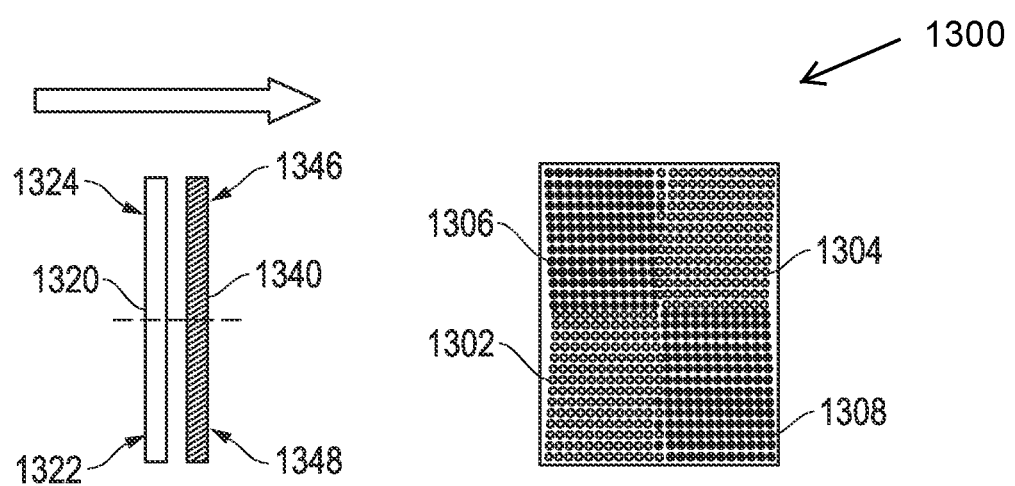
FIG. 12 includes an illustration of fluid dispensers and a fluid droplet pattern for an imprint field having fluid droplets where rotation in a Y-Z plane is used.

In prior embodiments, the fluid dispenser, the substrate, or both can be rotated in an X-Y plane. In such embodiments, the spacing between the fluid dispenser and substrate is substantially uniform. In further embodiments, the fluid dispenser, the substrate, or both may be rotated in a Y-Z plane, such that the spacing between the fluid dispenser and substrate vary along the length of the fluid dispense. For example, one end of the fluid dispenser may be closer to the substrate as compared to the other end of the fluid dispenser. The spacing may become progressively larger as the distance from the one end to the other end increases. The dispenser, the substrate or both may pivot about a centerline that is substantially perpendicular to the length of the fluid dispenser or may pivot about a point at or closer to an end of the fluid dispenser. In FIGS. 10 to 12, no rotation in the X-Y plane is required. The lengths of the fluid dispensers can be substantially parallel to the sides of the imprint fields.

FIG. 10 includes an illustration of an imprint field 1100 during the formation of a fluid droplet pattern. In FIG. 10, a single fluid dispenser 1160 can be used with different rotations during different passes. During a first pass, the fluid dispenser 1160 and the substrate are oriented such that a location 1162 represents a farther distance between the fluid dispenser 1160 and the substrate, and a location 1164 represents a closer distance between the fluid dispenser 1160 and the substrate. During the first pass, sets 1102 and 1104 of fluid droplets are dispensed onto the substrate within the imprint field 1100. After the first pass, the orientation remains the same, such that the location 1162 represents a farther distance between the fluid dispenser 1160 and the substrate, and the location 1164 represents a closer distance between the fluid dispenser 1160 and the substrate. During a second pass, sets 1106 and 1108 of fluid droplets are dispensed onto the substrate within the imprint field 1100. Thus, FIG. 10 illustrates another method of achieving the fluid droplet pattern as illustrated in FIG. 9.

FIG. 11 includes an illustration of an imprint field 1200 during the formation of a fluid droplet pattern. In FIG. 11, a single fluid dispenser 1260 can be used with rotation occurring during each passes. At the beginning of a first pass, the fluid dispenser 1260 and the substrate are oriented such that a location 1262 represents a farther distance between the fluid dispenser 1260 and the substrate, and a location 1264 represents a closer distance between the fluid dispenser 1260 and the substrate. During the first pass, the dispenser 1260 is rotated about an axis illustrated by a dashed line. At the end of the first pass, the fluid dispenser 1260 and the substrate are oriented such that a location 1266 represents a closer distance between the fluid dispenser 1260 and the substrate, and a location 1268 represents a farther distance between the fluid dispenser 1260 and the substrate. A set 1202 of fluid droplets is dispensed onto the substrate within the imprint field 1200. During a second pass, the rotation is reversed. At the beginning of the second pass, the fluid dispenser 1260 and the substrate are oriented such that a location 1282 represents a closer distance between the fluid dispenser 1260 and the substrate, and a location 1284 represents a farther distance between the fluid dispenser 1260 and the substrate. During the second pass, the dispenser 1260 is rotated about the axis illustrated by the dashed line. At the end of the second pass, the fluid dispenser 1260 and the substrate are oriented such that a location 1286 represents a farther distance between the fluid dispenser 1260 and the substrate, and a location 1288 represents a closer distance between the fluid dispenser 1260 and the substrate. A set 1206 of fluid droplets is dispensed onto the substrate within the imprint field 1200.

FIG. 12 includes an illustration of an imprint field 1300 during the formation of a fluid droplet pattern. In FIG. 12, a pair of fluid dispensers 1320 and 1340 can be rotated to form the fluid droplet pattern in a single pass. At the beginning of the pass, the fluid dispenser 1320 and the substrate are oriented such that a location 1322 represents a closer distance between the fluid dispenser 1320 and the substrate, and a location 1324 represents a farther distance between the fluid dispenser 1320 and the substrate; and the fluid dispenser 1340 and the substrate are oriented such that a location 1346 represents a closer distance between the fluid dispenser 1340 and the substrate, and a location 1348 represents a farther distance between the fluid dispenser 1340 and the substrate. In FIG. 12, a set 1302 of fluid droplets is dispensed onto the substrate by the dispenser 1320 using ports closer to the location 1322, a set 1304 of fluid droplets is dispensed onto the substrate by the dispenser 1320 using ports closer to the location 1324, a set 1306 of fluid droplets is dispensed onto the substrate by the dispenser 1340 using ports closer to the location 1346, a set 1308 of fluid droplets is dispensed onto the substrate by the dispenser 1340 using ports closer to the location 1348. Thus, FIG. 12 illustrates another method of achieving the fluid droplet pattern as illustrated in FIG. 9.

Figure 13:
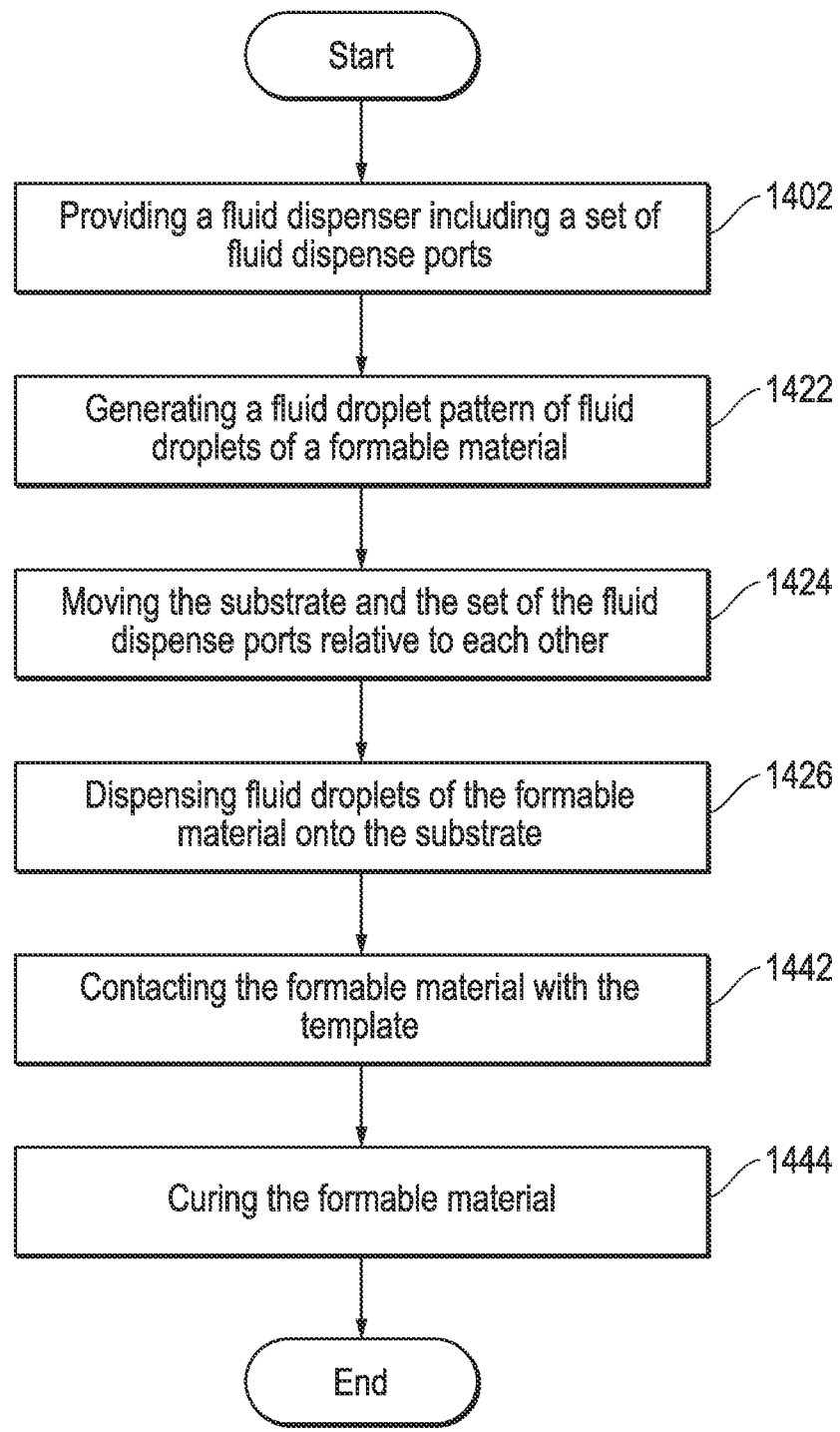
FIG. 13 includes a flow chart of an exemplary method of forming an article, including generating a fluid droplet pattern using the apparatus of FIG. 1.

In accordance with an embodiment described herein, FIG. 13 includes a flow chart for a method that can be used forming a substrate fluid droplet pattern for an imprint lithography process. The method is better understood with respect to the apparatus 10 in FIG. 1 and fluid dispenser and substrate orientations previously described. The method can include providing a fluid dispenser including a set of fluid dispense ports, at block 1402. In an embodiment, the method can be performed by an imprint lithography apparatus including a fluid dispense system, a stage, and a logic element.

The method can further include generating a fluid droplet pattern of fluid droplets of a formable material, at block 1422. At this point in the process, the fluid droplet pattern can be virtual pattern generated by the logic element. The logic element can include hardware, firmware, software, or any combination thereof to perform many of the operations described herein. In a particular embodiment, the logic element can be the processor 54. The fluid droplet pattern can be any of the patterns as previously described. The logic element may use a hardware and processing description of the apparatus 10 when determining the fluid droplet pattern. The hardware and processing description can include the number of fluid dispensers; when there are at least two fluid dispensers, the positions of the fluid dispensers relative to each other and the substrate; whether the one or more fluid dispensers or the substrate is rotated; the number of passes used to generate the fluid dispense pattern; the direction of motion of the substrate and fluid dispensers relative to one another; whether any fluid dispenser is rotated between passes; or the like.

A substrate can be placed on the stage, and in an embodiment, the substrate can be a semiconductor wafer. The method can further include moving the substrate and the set of the fluid dispense ports relative to each other, at block 1424, and dispensing fluid droplets of the formable material onto the substrate, at block 1426. After the substrate and the set of the fluid dispense ports start moving, the fluid droplets are dispensed onto the substrate to achieve a physical instantiation of the fluid droplet pattern corresponding to the virtual instantiation of the fluid droplet pattern generated by the logic element. Referring to FIG. 1, the processor can generate instructions that are transmitted to the imprint head 30 and the fluid dispense system 32 potentially, and a stage controller (not illustrated). The fluid dispense system can rotate the fluid dispenser or fluid dispenser, control movement of the fluid dispenser, and control dispensing of fluid droplets. The stage controller may rotate the substrate or move the substrate along one or more directions. After reading this specification, skilled artisans will appreciate that rotation and movement during a pass may achieved by moving the fluid dispenser, the substrate, or both the fluid dispenser and the substrate.

At block 1442, the method can include contacting the formable material with the template. Referring to FIG. 1, the imprint head 30, the stage 16, or both the imprint head 30 and the stage 16 vary a distance between the mold 20 and the substrate 12 to define a desired volume therebetween that is filled by the formable material 34. For example, the imprint head 30 can apply a force to the template 18, such that the mold 20 contacts the formable material 34 on the substrate 12. In an embodiment, the patterned surface has projections and recessions, and in another embodiment, the patterned surface can be a blank (a flat surface without any projections or recessions). The fluid droplet pattern allows the formable material to reach its desired locations more quickly along the sides of the imprint field without a significant risk of forming an extrusion defect.

At block 1444, the method includes curing the formable material to form a patterned layer corresponding to the pattern surface of the template. Curing can be performed by exposure to electromagnetic radiation. In an embodiment, the electromagnetic radiation can be ultraviolet radiation. In another embodiment, the formable material can be cured using heat. The patterned layer on the substrate has a complementary pattern as compared to the patterned surface of the template. Projections along the patterned layer correspond to recessions in the patterned surface of the template, and recessions in the patterned layer correspond to projections along the patterned surface of the template. The recessions in the patterned layer are parts of a residual layer having a residual layer thickness.

The methods can be useful in manufacturing an article that includes a substrate, such as an electronic component that includes part of a semiconductor wafer.

Many operations have been described with respect to particular components within the apparatus 10. In particular embodiment, operations performed by a logic element, which may be at least a part of the processor 54, may be performed by other components within the apparatus 10 or split between the processor 54 and such other components. For example, some operations previously described as being performed by the processor 54 may be performed by a stage controller that controls the operation of the stage 16, the fluid dispense system 32, a fluid dispenser controller that controls fluid dispenser. Furthermore, information can be transmitted in order to carry out the actions described herein. The information can be in the form of instructions to be executed, signals, pulses, or the like. The stage 16, the fluid dispense system 32, or both may include a controller that can act on instructions received from the processor 54. In another embodiment, the stage 16 or the fluid dispense system 32 may respond to analog signals received. For example, the information can be a particular direct current voltage or a light pulse. After reading this specification, skilled artisans will be able to configure an imprint lithography apparatus 10 to meet the needs or desires in view of the equipment within the apparatus 10. Thus, the description of the embodiments does not limit the scope of the present invention.

Embodiments of the apparatuses and method can be useful in filling an imprint field relatively quickly without extrusion defects or other complications. A virtual fluid droplet pattern can be generated by a logic element, such as a processor within a lithographic tool, to tailor the shape of the DEZ for a particular imprint surface of a template. Instructions corresponding to the virtual patterned can provided to a fluid dispense system in forming an actual fluid droplet pattern. The fluid droplet pattern can allow a formable material to reach points along sides of an imprint closer in time as compared to conventional techniques. The indentations of the patterns along sides help to keep the likelihood of forming an extrusion defect significantly low.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An imprint lithography method, the method comprising:
   generating a fluid droplet pattern of fluid droplets of a formable material to be dispensed in rows onto a substrate, wherein the fluid droplet pattern includes an imprint field, wherein:
      the imprint field has a side and a drop exclusion zone along the side; and
      the drop exclusion zone is narrower at a first point farther from a center of the side and wider at a second point closer to the center of the side;
   rotating a first fluid dispenser in a first rotational direction with respect to the side of the imprint field and a second fluid dispenser in a second rotational direction with respect to the side of the imprint field, wherein the first rotational direction is different from the second rotational direction; and
   dispensing fluid droplets of the formable material from the first fluid dispenser and the second fluid dispenser onto the substrate corresponding to the fluid droplet pattern, wherein the drop exclusion zone is defined by the side of the imprint field and a line passing through centers of fluid droplets that are closest to the side.

2. The method of claim 1, wherein dispensing the fluid droplets of the formable material is performed during a single pass using the first fluid dispenser and the second fluid dispenser that are in different rotational positions with respect to each other.

3. The method of claim 1, wherein dispensing the fluid droplets of the formable material comprises:
   dispensing a first set of fluid droplets using one of the first and the second fluid dispenser during a first pass;
   rotating the fluid dispenser, the substrate, or both; and
   dispensing a second set of the fluid droplets using the fluid dispenser during a second pass.

4. The method of claim 1, wherein dispensing the fluid droplets of the formable material comprises:
   dispensing a first set of the fluid droplets using the first fluid dispenser and a second set of fluid droplets using the second fluid dispenser during a pass; and
   rotating the first fluid dispenser, the second fluid dispenser, the substrate or any combination during the pass.

5. The method of claim 1, further comprising providing an apparatus having a fluid dispense system that includes the first fluid dispenser and the second fluid dispenser, wherein:
   the first fluid dispenser and the second fluid dispenser are oriented along adjacent sides of the imprint field before dispensing the fluid droplets;
   the first fluid dispenser has a length that lies along a first line;
   the second fluid dispenser has a length that lies along a second line; and
   the first and second lines intersect at an angle other than 90°.

6. The method of claim 5, wherein dispensing the fluid droplets of the formable material comprises:
   dispensing a first set of the fluid droplets using the first fluid dispenser; and
   dispensing a second set of the fluid droplets using the second fluid dispenser.

7. The method of claim 1, wherein generating the fluid droplet pattern is performed such that, wherein on an intra-row basis, fluid droplets from each of first and second passes or different fluid dispensers along a row has a predetermined local volume of the formable material.

8. The method of claim 7, wherein the fluid droplets from the first and second passes meet at a junction that is spaced apart from a central portion of the imprint field.

9. A method of manufacturing an article, the method comprising:
   providing a fluid dispense system having
   a first fluid dispenser having first fluid dispense ports and a second fluid dispenser having second fluid dispense ports
   the first fluid dispenser and the second fluid dispenser are oriented along adjacent sides of the imprint field before dispensing the fluid droplets, wherein the first fluid dispenser and the second fluid dispenser are in different rotational positions with respect to each other;
   generating a fluid droplet pattern of fluid droplets of a formable material to be dispensed onto a substrate, wherein the fluid droplet pattern includes an imprint field, wherein:
      the imprint field has a side and a drop exclusion zone along the side; and the drop exclusion zone is narrower at a first point farther from a center of the side and wider at a second point closer to the center of the side; and moving a substrate of the article and the first and second fluid dispense ports relative to each other;

dispensing fluid droplets of the formable material onto the substrate corresponding to the fluid droplet pattern, wherein the drop exclusion zone is defined by the side of the imprint field and a line passing through centers of fluid droplets that are closest to the side;

contacting the formable material with a template having a patterned surface; and curing the formable material to form a patterned layer corresponding to the patterned surface of the template.

10. The method of claim 9, wherein the article includes an electronic device, and the substrate includes a semiconductor wafer.

\* \* \* \* \*